US010263651B1

(12) United States Patent
Kitt (10) Patent No.: US 10,263,651 B1
(45) Date of Patent: Apr. 16, 2019

(54) SPATIAL POWER-COMBINING DEVICES WITH AMPLIFIER CONNECTORS

(71) Applicant: Qorvo US, Inc., Greensboro, NC (US)

(72) Inventor: John Kitt, Ventura, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/166,548

(22) Filed: Oct. 22, 2018

Related U.S. Application Data (62) Division of application No. 15/927,565, filed on Mar. 21, 2018.

(51) Int. Cl.
| | | |
|---|---|---|
| *H04B 1/04* | (2006.01) |
| *H01Q 1/48* | (2006.01) |
| *H03F 3/195* | (2006.01) |
| *H01Q 1/24* | (2006.01) |
| *H01Q 1/38* | (2006.01) |
| *H01P 5/12* | (2006.01) |
| *H03F 3/213* | (2006.01) |

(52) U.S. Cl.
CPC ............... *H04B 1/04* (2013.01); *H01P 5/12* (2013.01); *H01Q 1/48* (2013.01); *H03F 3/195* (2013.01); *H03F 3/213* (2013.01); *H03F 2200/451* (2013.01)

(58) Field of Classification Search
CPC .... H04B 1/04; H01P 5/12; H01P 5/02; H01Q 1/48; H01Q 9/28; H01Q 7/06; H01Q 1/24; H01Q 13/00; H01Q 1/38; H03F 3/195; H03F 3/213; H03F 2200/451
See application file for complete search history.

(56) References Cited

U.S. PATENT DOCUMENTS

| | | |
|---|---|---|
| 5,036,335 A | 7/1991 | Jairam |
| 5,736,908 A | 4/1998 | Alexanian et al. |
| 5,920,240 A | 7/1999 | Alexanian et al. |
| 6,028,483 A | 2/2000 | Shealy et al. |

(Continued)

OTHER PUBLICATIONS

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

(Continued)

*Primary Examiner* — Pablo N Tran
(74) *Attorney, Agent, or Firm* — Withrow & Terranova, P.L.L.C.

(57) ABSTRACT

Spatial power-combining devices having amplifier connectors are disclosed. A spatial power-combining device structure includes a plate including a first face, a second face that opposes the first face, an exterior surface between the first face and the second face, and a plurality of amplifier connectors accessible at the exterior surface. A waveguide assembly is coupled to the plate at the first face, the waveguide assembly including an inner housing including a plurality of antenna signal conductors and an outer housing including a plurality of antenna ground conductors. A coaxial waveguide section is coupled to the waveguide assembly. The plurality of amplifier connectors may be radially arranged in the plate. A plurality of amplifier modules are on the exterior surface and coupled to corresponding ones of the plurality of amplifier connectors.

10 Claims, 11 Drawing Sheets

(56) References Cited

U.S. PATENT DOCUMENTS

| | | | |
|---|---|---|---|
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1* | 5/2007 | Jia .................. H01P 5/12 333/125 |
| 8,928,429 | B2 | 1/2015 | Song et al. |
| 9,054,427 | B2 | 6/2015 | Guy et al. |
| 9,065,163 | B1 | 6/2015 | Wu et al. |
| 9,276,304 | B2* | 3/2016 | Behan ............... H01Q 9/28 |
| 9,287,605 | B2* | 3/2016 | Daughenbaugh, Jr. .............. H01Q 13/08 |
| 9,293,801 | B2* | 3/2016 | Courtney ............ H01Q 9/28 |
| 9,917,343 | B2 | 3/2018 | Chieh et al. |
| 9,954,706 | B1 | 4/2018 | Harris et al. |
| 10,003,118 | B2* | 6/2018 | Kitt ................... H01P 5/12 |
| 10,009,067 | B2 | 6/2018 | Birk et al. |
| 2014/0145794 | A1 | 5/2014 | Courtney et al. |
| 2014/0167880 | A1 | 6/2014 | Daughenbaugh, Jr. et al. |
| 2017/0149113 | A1 | 5/2017 | Theveneau et al. |
| 2017/0179598 | A1 | 6/2017 | Kitt |
| 2019/0007007 | A1 | 1/2019 | Kitt |

OTHER PUBLICATIONS

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Bathe TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Notice of Allowance for U.S. Appl. No. 15/845,225, dated Jan. 10, 2019, 7 pages.

U.S. Appl. No. 15/845,225, filed Dec. 18, 2017.
U.S. Appl. No. 15/933,783, filed Mar. 23, 2018.
U.S. Appl. No. 16/032,252, filed Jul. 11, 2018.
U.S. Appl. No. 16/042,351, filed Jul. 23, 2018.
U.S. Appl. No. 16/008,586, filed Jun. 14, 2018.
U.S. Appl. No. 15/846,840, filed Dec. 19, 2017.
U.S. Appl. No. 15/981,535, filed May 16, 2018.
U.S. Appl. No. 15/981,516, filed May 16, 2018.
U.S. Appl. No. 15/933,821, filed Mar. 23, 2018.
U.S. Appl. No. 16/039,435, filed Jul. 19, 2018.

* cited by examiner

SPATIAL POWER-COMBINING DEVICES WITH AMPLIFIER CONNECTORS

RELATED APPLICATIONS

The present application is a divisional of U.S. patent application Ser. No. 15/927,565, filed Mar. 21, 2018, now U.S. Pat. No. 10,164,667, the disclosure of which is hereby incorporated herein by reference in its entirety.

FIELD OF THE DISCLOSURE

The disclosure relates generally to a spatial power-combining device, and in particular to a spatial power-combining device with amplifier connectors.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, input antennas may form an input antipodal antenna array, and output antennas may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

An antenna for conventional spatial power-combining devices typically includes a metal antenna signal conductor and a metal antenna ground conductor deposited on opposite sides of a substrate, such as a printed circuit board. The printed circuit board provides a desired form factor and mechanical support for the antenna signal conductor and the antenna ground conductor; however, the printed circuit board can become increasingly lossy at higher frequencies, thereby limiting the combining efficiency and achievable output power of the antenna.

An amplifier for a conventional spatial power-combining device is typically located between an input antenna structure and an output antenna structure within each amplifier assembly of a plurality of amplifier assemblies. When the plurality of amplifier assemblies are coaxially arranged, the amplifiers are thus radially arranged within the spatial power-combining device. This configuration positions a separate amplifier along each of multiple signal paths such that an incoming signal may be split, amplified by multiple amplifiers in parallel, and combined. However, the output power and efficiency of typical configurations can have limitations related to thermal capabilities of the amplifiers. As the operating temperature of an amplifier increases, the efficiency can decrease and thereby limit the output power.

SUMMARY

The present disclosure relates to spatial power-combining devices and, in particular, to spatial power-combining devices with amplifier connectors. Exemplary spatial power-combining devices may have increased efficiency and higher overall output power.

In this regard, in one aspect, a spatial power-combining device structure comprises a plate comprising a first face, a second face that opposes the first face, an exterior surface between the first face and the second face, and a plurality of amplifier connectors accessible at the exterior surface. A waveguide assembly is coupled to the plate at the first face, the waveguide assembly comprising an inner housing comprising a plurality of output antenna signal conductors and an outer housing comprising a plurality of output antenna ground conductors. An output coaxial waveguide section is coupled to an antenna assembly. The plurality of amplifier connectors may be radially arranged in the plate. The spatial power-combining device may further comprise a plurality of amplifier modules on the exterior surface and coupled to corresponding ones of the plurality of amplifier connectors. In some aspects, the plurality of output antenna signal conductors are completely separated from the plurality of output antenna ground conductors by air. The plurality of output antenna signal conductors may be interdigitated with the plurality of output antenna ground conductors.

In another aspect, a spatial power-combining device comprises a plate comprising a first face, a second face that opposes the first face, an exterior surface between the first face and the second face, and a plurality of amplifier connectors accessible at the exterior surface. A plurality of amplifier modules are coupled to corresponding ones of the plurality of amplifier connectors. An input waveguide assembly is coupled to the plate at the first face, and an output waveguide assembly is coupled to the plate at the second face. In some aspects, the input waveguide assembly comprises an input inner housing comprising a plurality of input antenna signal conductors and an input outer housing comprising a plurality of input antenna ground conductors. The plurality of input antenna signal conductors may be completely separated from the plurality of input antenna ground conductors by air. In some aspects, the output waveguide assembly comprises an output inner housing comprising a plurality of output antenna signal conductors and an output outer housing comprising a plurality of output antenna ground conductors. The plurality of output antenna signal conductors may be completely separated from the plurality of output antenna ground conductors by air.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein include spatial power-combining devices and, in particular, spatial power-combining devices with amplifier connectors. Exemplary spatial power-combining devices have improved thermal capabilities as well as increased efficiency and overall output power.

The embodiments are particularly adapted to spatial power-combining devices that operate at microwave frequencies such as, by way of non-limiting example, energy between about 300 megahertz (MHz) (100 centimeter (cm) wavelength) and 300 gigahertz (GHz) (0.1 cm wavelength). Additionally, embodiments may comprise operating frequency ranges that extend above microwave frequencies. A spatial power-combining device may operate within one or more common radar bands including, but not limited to, S-band, C-band, X-band, Ku-band, K-band, Ka-band, and Q-band. In some embodiments, by way of non-limiting examples, the operating frequency range includes an operating bandwidth spread of 2 GHz to 20 GHz. In other embodiments, the operating frequency range includes an operating bandwidth spread of 4 GHz to 41 GHz. In still further embodiments, the operating frequency range includes frequencies of 40 GHz and higher, such as operating frequency ranges of 2 GHz to 400 GHz, 20 GHz to 120 GHz, 40 GHz and 400 GHz, and 70 GHz to 400 GHz. Accordingly, a spatial power-combining device as described herein may be configured to transmit electromagnetic signals in a microwave frequency range and higher.

A spatial power-combining device generally includes a plurality of signal paths that include an amplifier connected to an output antenna structure of an output center waveguide. The output antenna structure may comprise an output antenna ground conductor and an output antenna signal conductor that are entirely separated by air. An output coaxial waveguide may be configured to concurrently combine amplified signals from the output antenna structure. Each signal path may further comprise an input antenna structure in which each input antenna structure comprises an input antenna ground conductor and an input antenna signal conductor that are entirely separated by air. An input coaxial waveguide may be configured to provide a signal concurrently to each input antenna structure. The plurality of signal paths may be arranged coaxially about a center axis. Accordingly, the spatial power-combining device may be configured to split, amplify, and combine an electromagnetic signal. Separating the antenna ground conductors and the antenna signal conductors by air eliminates any lossy materials of conventional antenna structures on printed circuit boards and, among other advantages, facilitates spatial power-combining devices with antenna structures sized for ultra-broadband microwave operation.

As the operating temperature of an amplifier increases, for example in high power applications, the efficiency can decrease and thereby limit the overall output power. In that regard, spatial power-combining devices described herein include amplifiers having improved thermal capabilities. In some embodiments, an antenna structure is coupled to a plate and electrically connected to an amplifier connector that is within the plate. Another end of the amplifier connector is accessible at an exterior surface of the plate where an amplifier or an amplifier module is connected. Accordingly, the amplifier may be thermally separated or external from a center waveguide, but still electrically connected to the center waveguide by the amplifier connector. In such a configuration, the amplifier may be positioned closer to a heat sink that is external to the center waveguide and the antenna structure of a spatial power-combining device. In further configurations, a thermally conductive structure may be configured between the amplifier and the plate to provide further heat dissipation. The thermally conductive structure may be a solid material or a hollow structure configured for fluid cooling. In some aspects, the thermally conductive structure is thermally coupled to the heat sink.

Figure 1A:
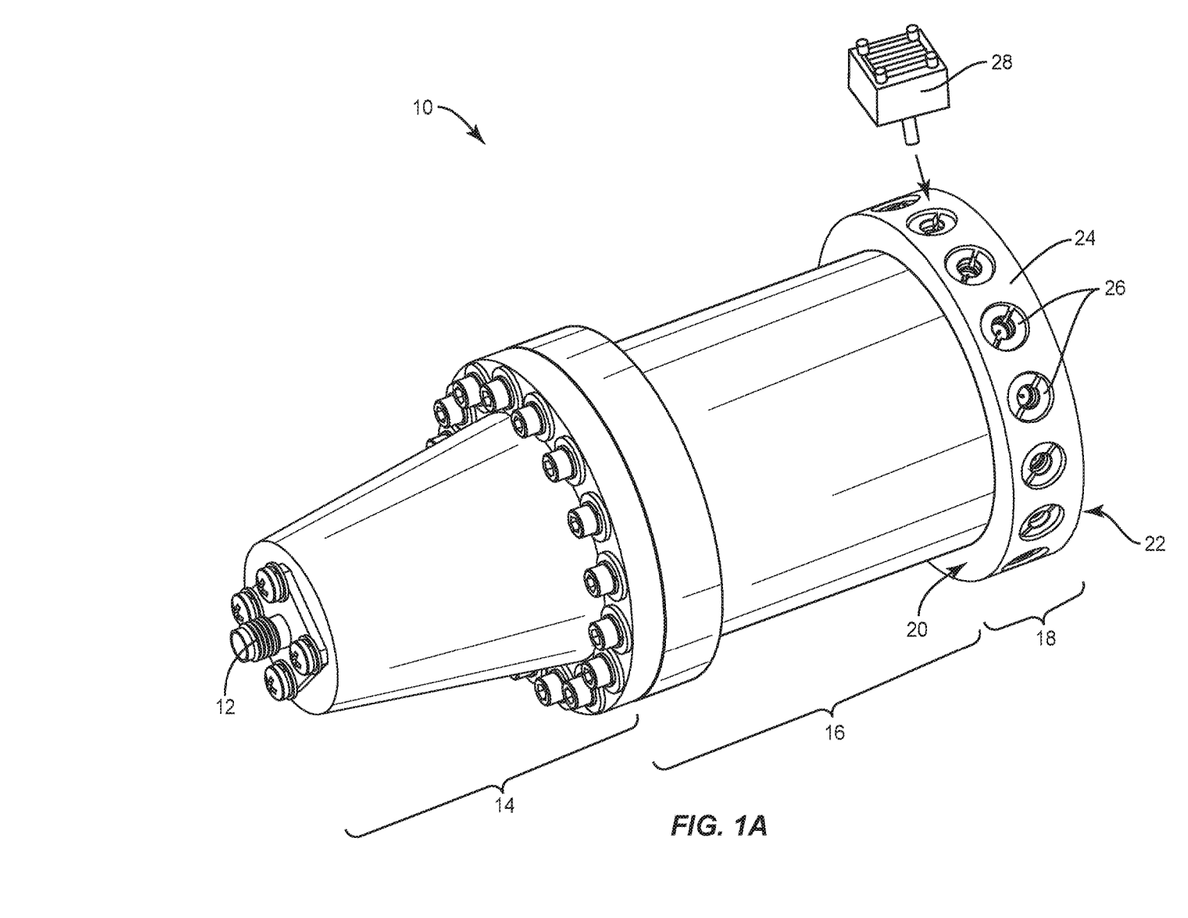
FIG. 1A is a partially-exploded perspective view of a spatial power-combining device structure according to some embodiments.

Accordingly, exemplary spatial power-combining devices have increased efficiency and higher overall output power. In that regard, FIG. 1A is a partially-exploded perspective view of a spatial power-combining device structure 10 according to some embodiments. The spatial power-combining device structure 10 includes an output port 12, an output coaxial waveguide section 14, an output center waveguide section 16, and a plate 18. Electrically, the output coaxial waveguide section 14 provides broadband impedance matching from an impedance $Z_c$ of the output center waveguide section 16 to an impedance $Z_{p2}$ of the output port 12. The output port 12 may comprise a field-replaceable Subminiature A (SMA) connector. In other embodiments, the output port 12 may comprise a super SMA connector, a type N connector, a type K connector, a WR28 connector, other coaxial to waveguide transition connectors, or any other suitable connectors. The plate 18 includes a first face 20, a second face 22 that opposes the first face 20, and an exterior surface 24 that is between the first face 20 and the second face 22. The output center waveguide section 16 is coupled to the plate 18 at the first face 20. The output coaxial waveguide section 14, the output center waveguide section 16, and the plate 18 may comprise a thermally conductive metal, such as aluminum or alloys thereof.

The plate 18 further includes a plurality of amplifier connectors 26 that are accessible at the exterior surface 24. In some embodiments, the plurality of amplifier connectors 26 are radially arranged in the plate 18. The plurality of amplifier connectors 26 may be any type of Radio Frequency (RF) connector including SMP and BMB connectors, among others. In FIG. 1A, a single amplifier module 28 is illustrated above the plate 18 with an arrow pointing toward a corresponding amplifier connector 26. After assembly, the amplifier module 28 is configured on the exterior surface 24 of the plate 18 and coupled to the corresponding amplifier connector 26. It is understood the spatial power-combining device structure 10 may include a plurality of amplifier modules 28 on the exterior surface 24 and coupled to corresponding amplifier connectors 26 of the plurality of amplifier connectors 26.

The amplifier module 28 may comprise a Monolithic Microwave Integrated Circuit (MMIC) amplifier. A MMIC may be a solid-state gallium nitride (GaN) based MMIC. A GaN MMIC device provides high power density and bandwidth, and a spatial power-combining device may combine power from a plurality of GaN MMICs efficiently in a single step to minimize combining loss. Each amplifier module 28 is configured to provide at least a portion of an amplified signal to a corresponding amplifier connector 26. The output center waveguide section 16 and the output coaxial waveguide section 14 are configured to concurrently receive the amplified signal from the plurality of amplifier connectors 26.

It is understood that structurally, an input side of a spatial power-combining device may substantially mirror the output side. Accordingly, the above description of the spatial power-combining device structure 10 would also apply to an input side of a spatial power-combining device by replacing the term "output" with the term "input." In operation, the input side is configured to receive and split a signal for amplification and the output side is configured to combine amplified signals into an output signal.

Figure 1B:
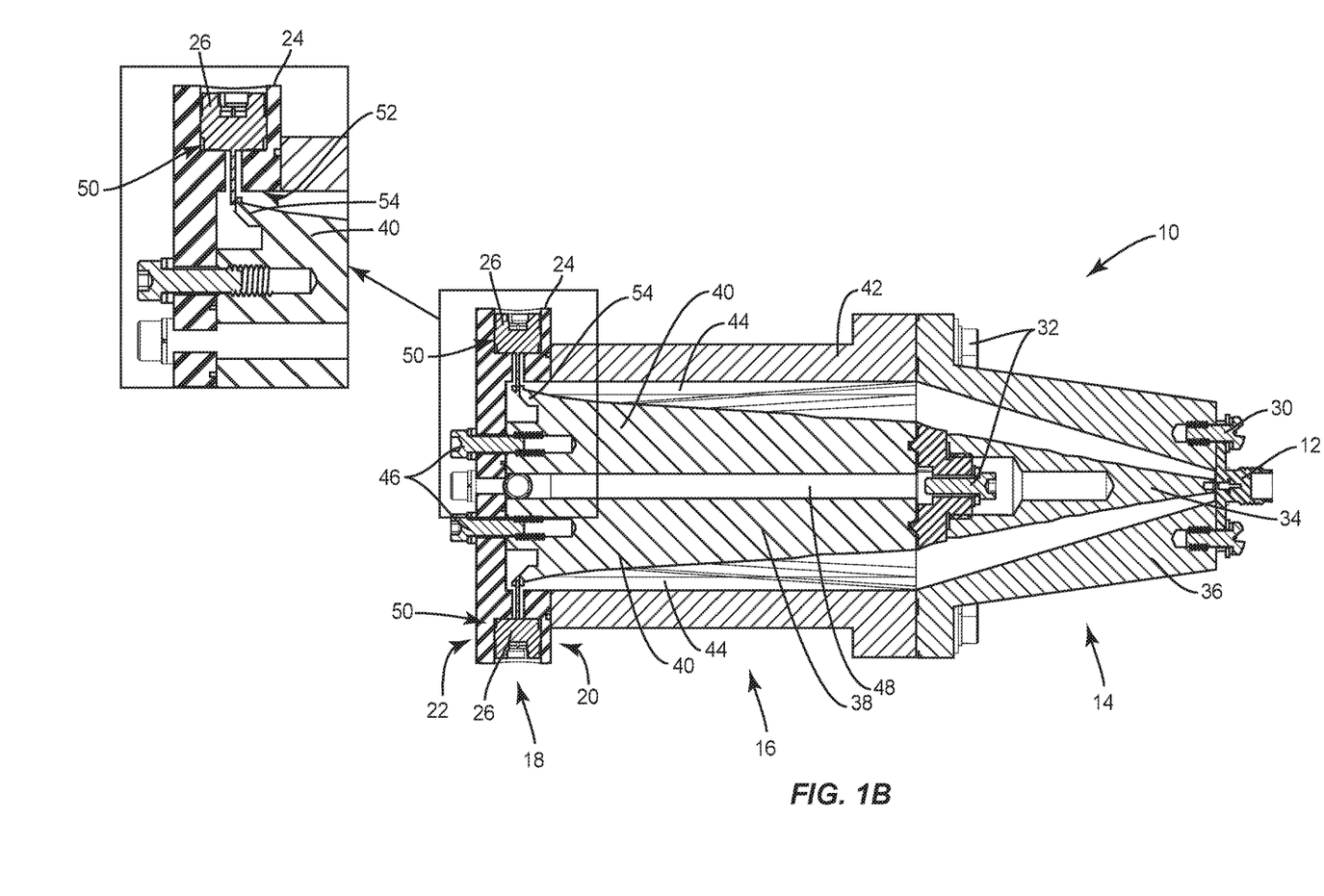
FIG. 1B is a partial cross-sectional view of the spatial power-combining device structure of FIG. 1A.

FIG. 1B is a partial cross-sectional view of the spatial power-combining device structure 10 of FIG. 1A. The output port 12 may be secured to the output coaxial waveguide section 14 by way of one or more screws 30, and the output coaxial waveguide section 14 may be secured to the output center waveguide section 16 by way of one or more screws 32, although other mechanical fastening techniques may be used. The output coaxial waveguide section 14 includes an output inner conductor 34 and an output outer conductor 36. Outer surfaces of the output inner conductor 34 and inner surfaces of the output outer conductor 36 have gradually changed profiles configured to minimize an impedance mismatch from the output port 12 to the output center waveguide section 16. The output center waveguide section 16 includes an output inner housing 38 including a plurality of output antenna signal conductors 40 and an output outer housing 42 including a plurality of output antenna ground conductors 44. The output center waveguide section 16 is coupled to the first face 20 of the plate 18 and may be secured to the plate 18 by way of one or more screws 46, although other mechanical fastening techniques may be used. The output inner housing 38 may include a center cavity 48 for receiving the one or more screws 32. The plate 18 further comprises the second face 22, the exterior surface 24, and the plurality of amplifier connectors 26 as previously described. Each amplifier connector 26 is located within a corresponding one of a plurality of openings 50 in the plate 18.

Each amplifier connector 26 may be coupled to a corresponding opening 50 in a variety of ways including, but not limited to, a threaded or screw-in connection and a snap-fit or press-fit connection. As previously described, each amplifier connector 26 is accessible at the exterior surface 24 for coupling with a corresponding amplifier module 28 (FIG. 1A). Each amplifier connector 26 is exposed at an interior surface 52 of the plate 18. Each output antenna signal conductor 40 comprises an output signal connector 54 that is electrically coupled to a corresponding amplifier connector 26 at the interior surface 52. In this manner, each amplifier module 28 (FIG. 1A) is electrically coupled to a corresponding output antenna signal conductor 40 by way of a corresponding amplifier connector 26. In some embodiments, an output antenna signal conductor 40 is coupled to a corresponding amplifier connector 26 without an intervening waveguide. In further embodiments, an output antenna signal conductor 40 may be directly coupled to a corresponding amplifier connector 26.

Figure 2A:
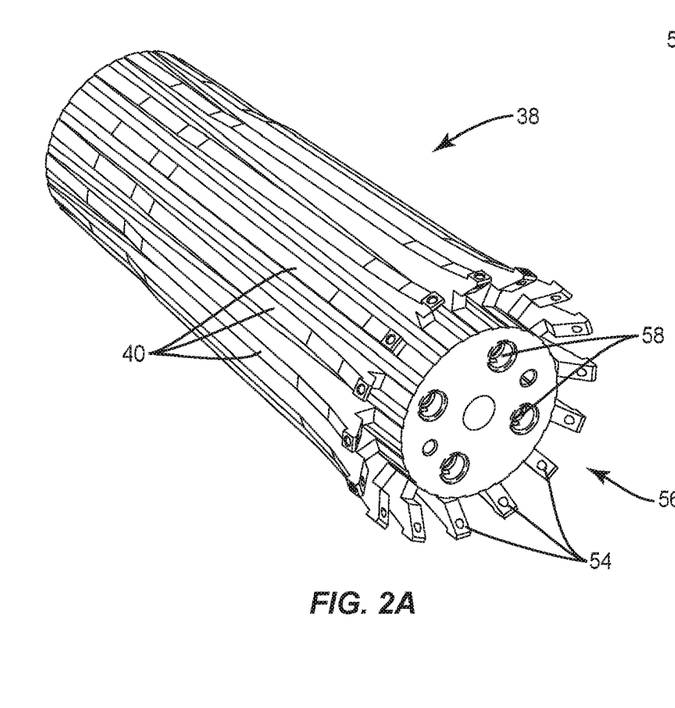
FIG. 2A is a perspective view of the output inner housing of FIG. 1B.
Figure 2B:
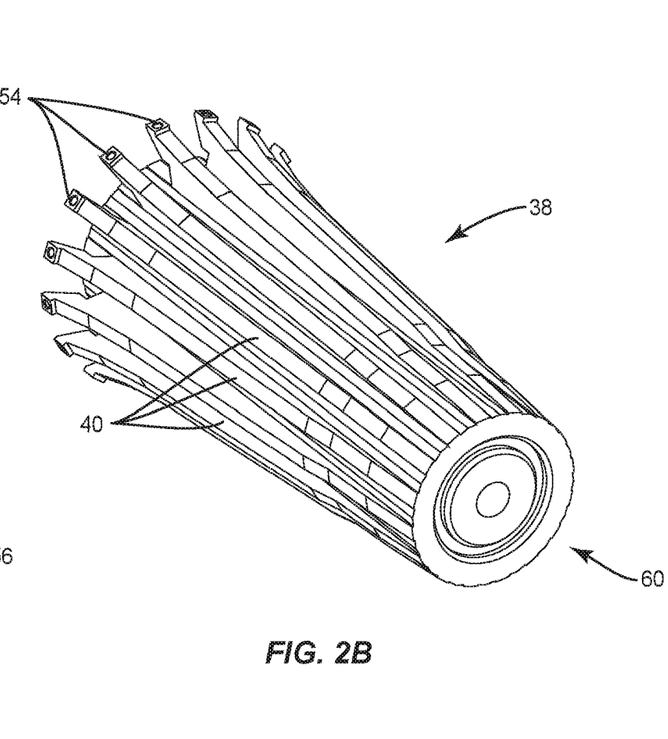
FIG. 2B is a different perspective view of the output inner housing of FIG. 1B.

FIG. 2A is a perspective view of the output inner housing 38 of FIG. 1B. As previously described, the output inner housing 38 comprises the plurality of output antenna signal conductors 40 and a plurality of output signal connectors 54. In some embodiments, the plurality of output antenna signal conductors 40 and the plurality of output signal connectors 54 are an integral single component with the output inner housing 38. The output inner housing 38 comprises a first end face 56 that is configured to be coupled with the plate 18 (FIG. 1B) by way of screw holes 58, although other mechanical attachment techniques are possible. FIG. 2B is a different perspective view of the output inner housing 38. The output inner housing 38 comprises a second end face 60 that is configured to be coupled with the output coaxial waveguide section 14 (FIG. 1B) and, in particular, the second end face 60 is configured to be coupled with the output inner conductor 34 (FIG. 1B). The output inner housing 38 may comprise a thermally conductive metal, such as aluminum or alloys thereof. It is understood that structurally, an input side of a spatial power-combining device may substantially mirror the output side. Accordingly, the above description of the output inner housing 38 would also apply to an input inner housing of a spatial power-combining device by replacing the term "output" with the term "input."

Figure 3A:
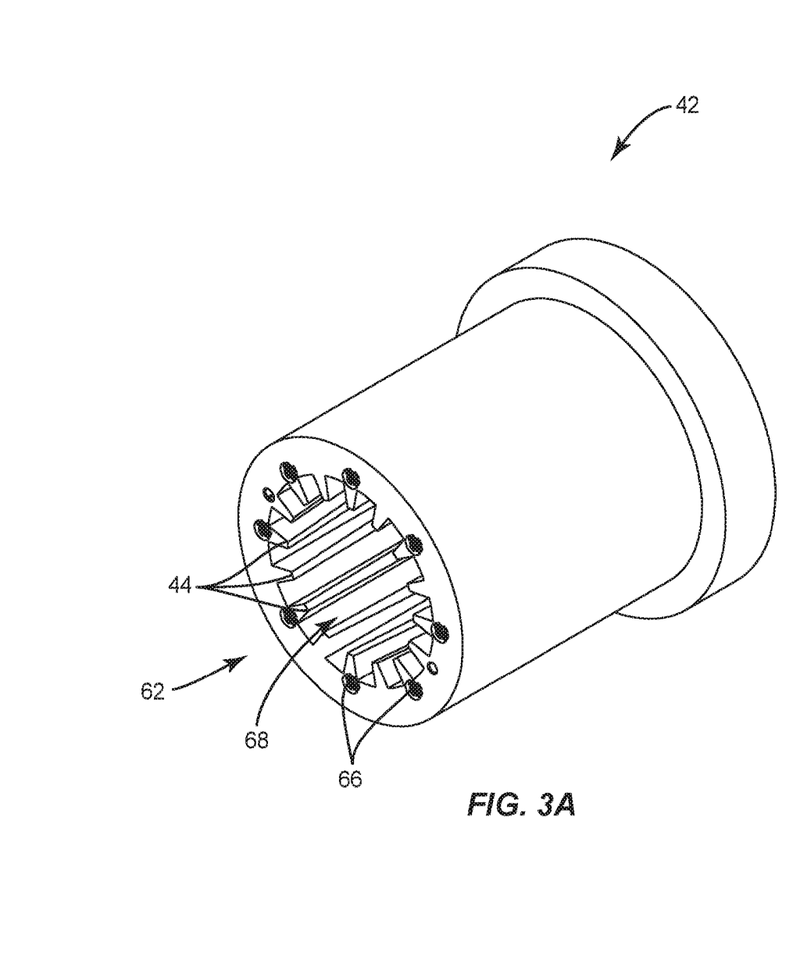
FIG. 3A is a perspective view of the output outer housing of FIG. 1B.
Figure 3B:
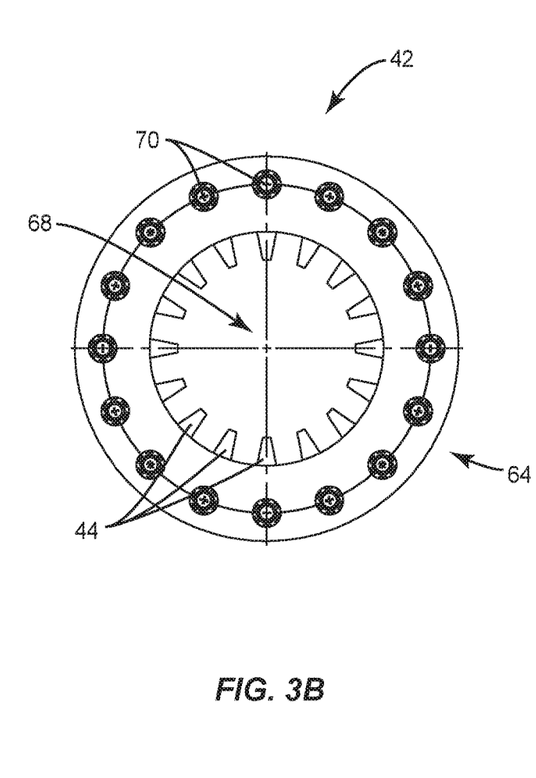
FIG. 3B is an end view of the output outer housing of FIG. 1B.

FIG. 3A is a perspective view of the output outer housing 42 of FIG. 1B. As previously described, the output outer housing 42 comprises the plurality of output antenna ground conductors 44. In some embodiments, the plurality of output antenna ground conductors 44 are an integral single component with the output outer housing 42. The output outer housing 42 comprises a first end face 62 and a second end face 64. The first end face 62 is configured to be coupled with the plate 18 (FIG. 1B) by way of screw holes 66, although other mechanical attachment techniques are possible. The output outer housing 42 further comprises an interior opening 68, and the plurality of output antenna ground conductors 44 protrude within the interior opening 68. FIG. 3B is an end view of the output outer housing 42 from the second end face 64. The plurality of output antenna ground conductors 44 are configured radially within the interior opening 68. The second end face 64 is configured to be coupled with the output coaxial waveguide section 14 (FIG. 1B) by way of screw holes 70, although other mechanical attachment techniques are possible. In particular, the second end face 64 is configured to be coupled with the output outer conductor 36 (FIG. 1B). The output outer housing 42 may comprise a thermally conductive metal, such as aluminum or alloys thereof. It is understood that structurally, an input side of a spatial power-combining device may substantially mirror the output side. Accordingly, the above description of the output outer housing 42 would also apply to an input outer housing of a spatial power-combining device by replacing the term "output" with the term "input."

Figure 4A:
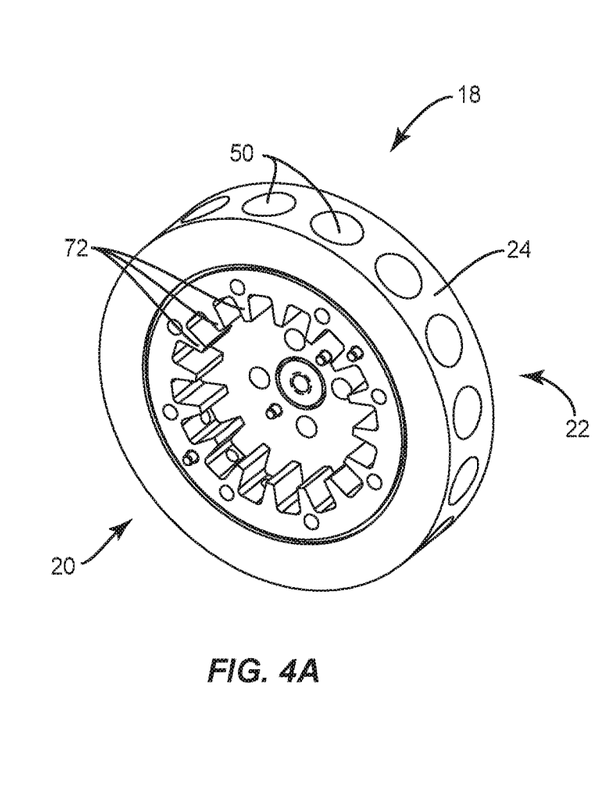
FIG. 4A is a perspective view of the plate of FIG. 1B.
Figure 4B:
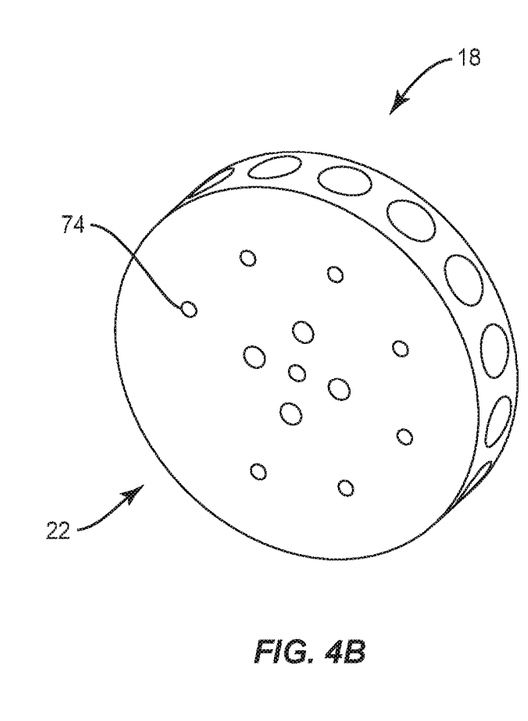
FIG. 4B is a different perspective view of the plate of FIG. 1B.

FIG. 4A is a perspective view of the plate 18 of FIG. 1B. As previously described, the plate 18 includes the first face 20, the second face 22 that opposes the first face 20, the exterior surface 24 that is between the first face 20 and the second face 22, and the plurality of openings 50. The plate 18 further comprises a plurality of plate conductors 72 that are radially arranged within the plate 18. The plurality of openings 50 are through holes that extend from the exterior surface 24 to positions inside the plate 18 that are located between the plurality of plate conductors 72. The first face 20 is configured to be coupled with both the output inner housing 38 (FIG. 2A) and the output outer housing 42 (FIG. 3A). When coupled, the plurality of output signal connectors 54 (FIG. 2A) are configured between the plurality of plate conductors 72 to align with the plurality of openings 50. The plurality of output antenna ground conductors 44 (FIG. 3A) align with the plurality of plate conductors 72. FIG. 4B is a perspective view of the plate 18 of FIG. 1B from the second face 22. Various holes 74 are configured for mechanical attachment with the output inner housing 38 (FIG. 2A) and the output outer housing 42 (FIG. 3A). The plate 18 may comprise a thermally conductive metal, such as aluminum or alloys thereof.

Figure 5A:
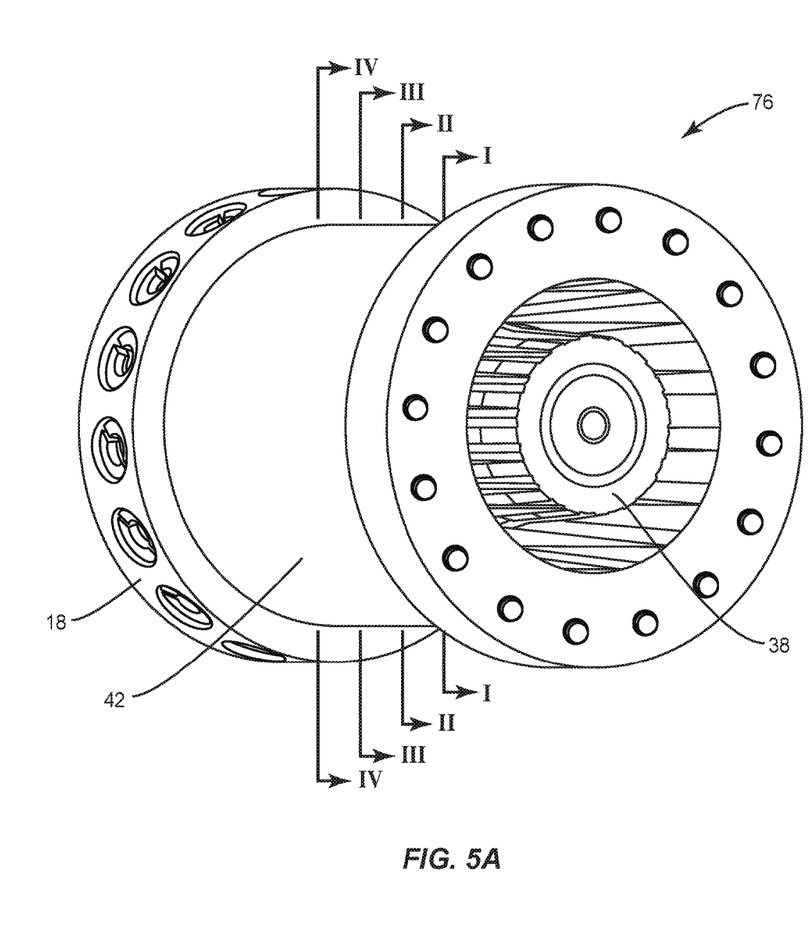
FIG. 5A is a perspective view of a spatial power-combining device structure according to some embodiments.
Figure 5B:
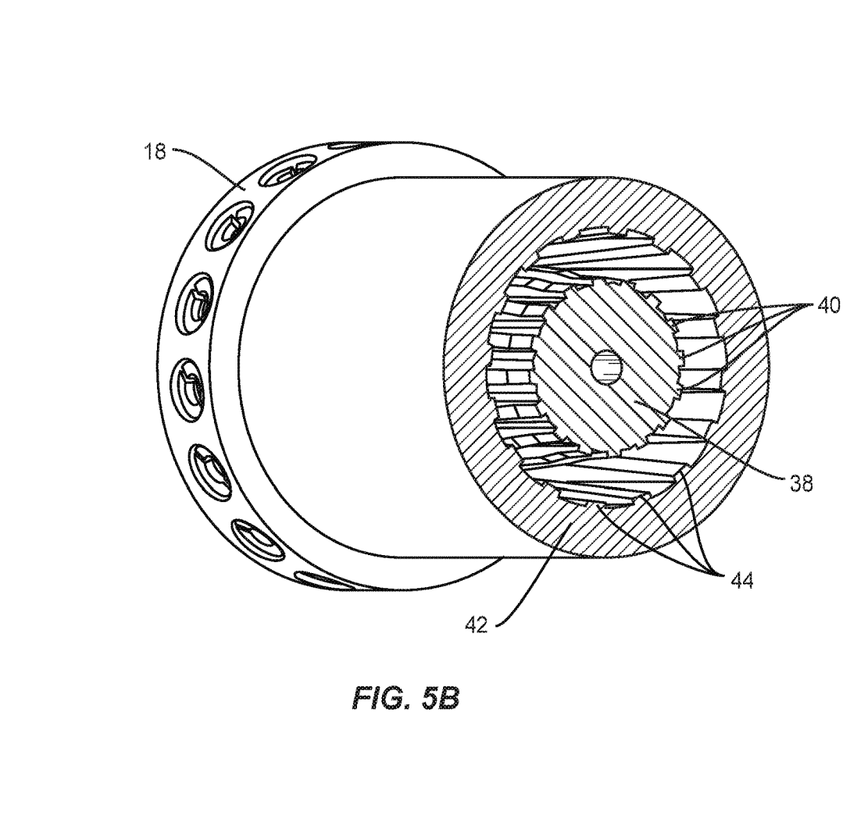
FIG. 5B is a perspective view of a cross-section taken along section line I-I of the spatial power-combining device structure of FIG. 5A.
Figure 5C:
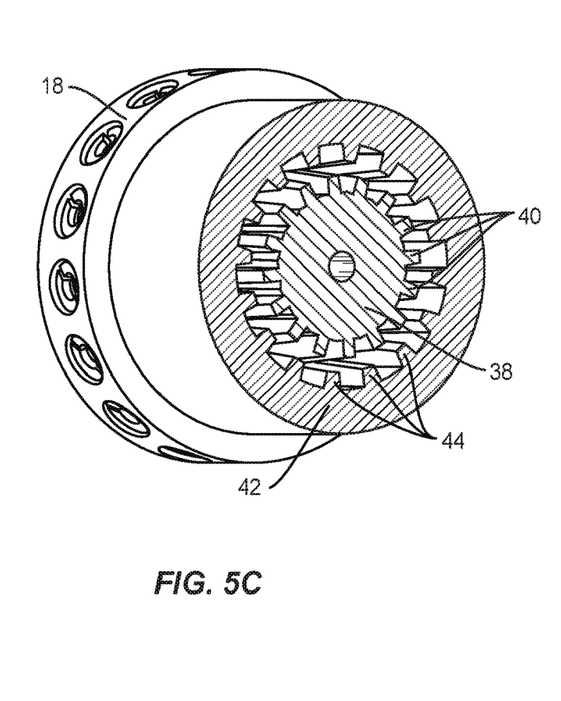
FIG. 5C is a perspective view of a cross-section taken along section line II-II of the spatial power-combining device structure of FIG. 5A.
Figure 5D:
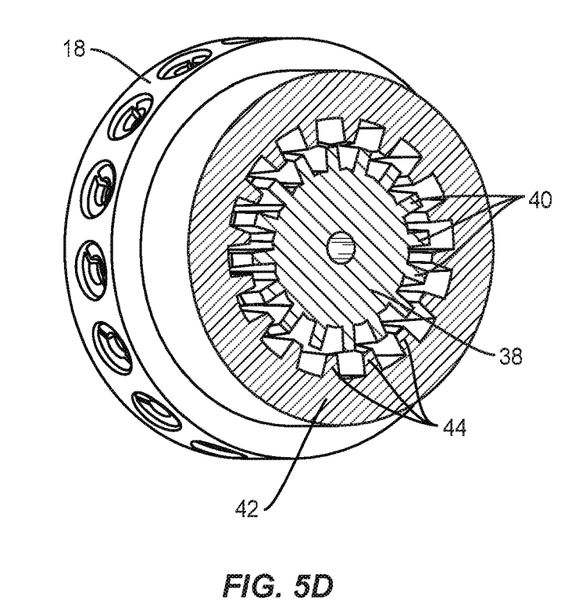
FIG. 5D is a perspective view of a cross-section taken along section line III-Ill of the spatial power-combining device structure of FIG. 5A.
Figure 5E:
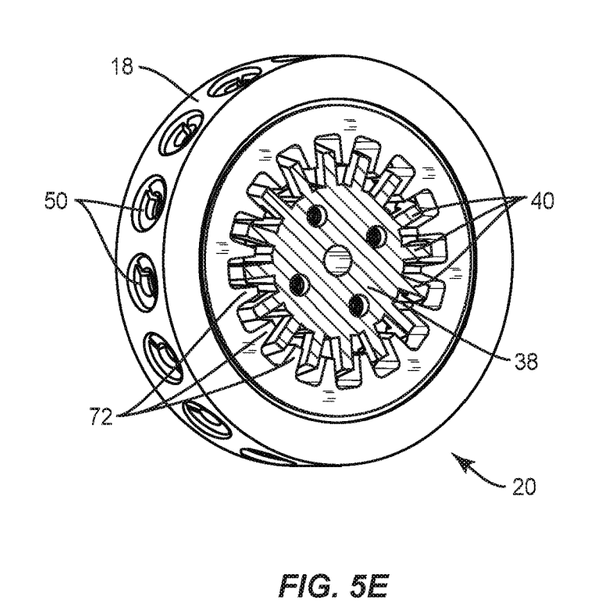
FIG. 5E is a perspective view of a cross-section taken along section line IV-IV of the spatial power-combining device structure of FIG. 5A.

FIG. 5A is a perspective view of a spatial power-combining device structure 76 according to some embodiments. The assembled spatial power-combining device structure 76 includes the plate 18, the output inner housing 38, and the output outer housing 42 as previously described. When assembled, the output inner housing 38 is configured inside the output outer housing 42, and both the output inner housing 38 and the output outer housing 42 are coupled to the plate 18. FIG. 5B is a perspective view of a cross-section taken along section line I-I of the spatial power-combining device structure 76 of FIG. 5A. The output inner housing 38 comprises the plurality of output antenna signal conductors 40, and the output outer housing 42 comprises the plurality of output antenna ground conductors 44. FIG. 5C is a perspective view of a cross-section taken along section line II-II of the spatial power-combining device structure 76 of FIG. 5A that is closer to the plate 18 than section line Id. The plurality of output antenna signal conductors 40 and the plurality of output antenna ground conductors 44 extend closer towards each other between the output inner housing 38 and the output outer housing 42. FIG. 5D is a perspective view of a cross-section taken along section line III-III of the spatial power-combining device structure 76 of FIG. 5A that is closer to the plate 18 than section line II-II. The plurality of output antenna signal conductors 40 and the plurality of output antenna ground conductors 44 extend even closer towards each other between the output inner housing 38 and the output outer housing 42. Notably, the plurality of output antenna signal conductors 40 and the plurality of output antenna ground conductors 44 are separated by air. Further, the plurality of output antenna signal conductors 40 are radially alternated with the plurality of output antenna ground conductors 44. In further embodiments, the plurality of output antenna signal conductors 40 are radially alternated with the plurality of output antenna ground conductors 44 by equal distances. This improves manufacturing tolerances as minor deviations in placement will be less likely to cause a short between the plurality of output antenna signal conductors 40 and the plurality of output antenna ground conductors 44. FIG. 5E is a perspective view of a cross-section taken along section line IV-IV of the spatial power-combining device structure 76 of FIG. 5A that is aligned with the first face 20 of the plate 18. The plurality of plate conductors 72 are visible, and the plurality of output antenna signal conductors 40 of the output inner housing 38 are configured between the plurality of plate conductors 72 to align with the plurality of openings 50.

As represented by the section lines I-I, II-II, III-III, and IV-IV (FIG. 5A), the plurality of output antenna signal conductors 40 and the plurality of output antenna ground conductors 44 are configured to be progressively closer to each other as they extend towards the plate 18. The plurality of output antenna signal conductors 40 and the plurality of output antenna ground conductors 44 form an output antenna structure that is configured to concurrently receive portions of an amplified signal. In some embodiments, the plurality of output antenna signal conductors 40 are separated from the plurality of output antenna ground conductors 44 by air, while in further embodiments, the plurality of output antenna signal conductors 40 are completely separated from the plurality of output antenna ground conductors 44 by air. This may be accomplished by forming the plurality of output antenna signal conductors 40 and the plurality of output antenna ground conductors 44 with metal that is thick enough to not require a supporting substrate, such as a printed circuit board. In some embodiments, the metal may comprise the same metal as the output inner housing 38 and the output outer housing 42. The metal may comprise, for example, aluminum or alloys thereof. Accordingly, any lossy materials of conventional antenna structures on printed circuit boards are eliminated. This also provides the ability to scale down antenna designs for higher frequency ranges not previously attainable and, among other advantages, a spatial power-combining device may include antenna structures sized for ultra-broadband microwave operation.

Figure 6:
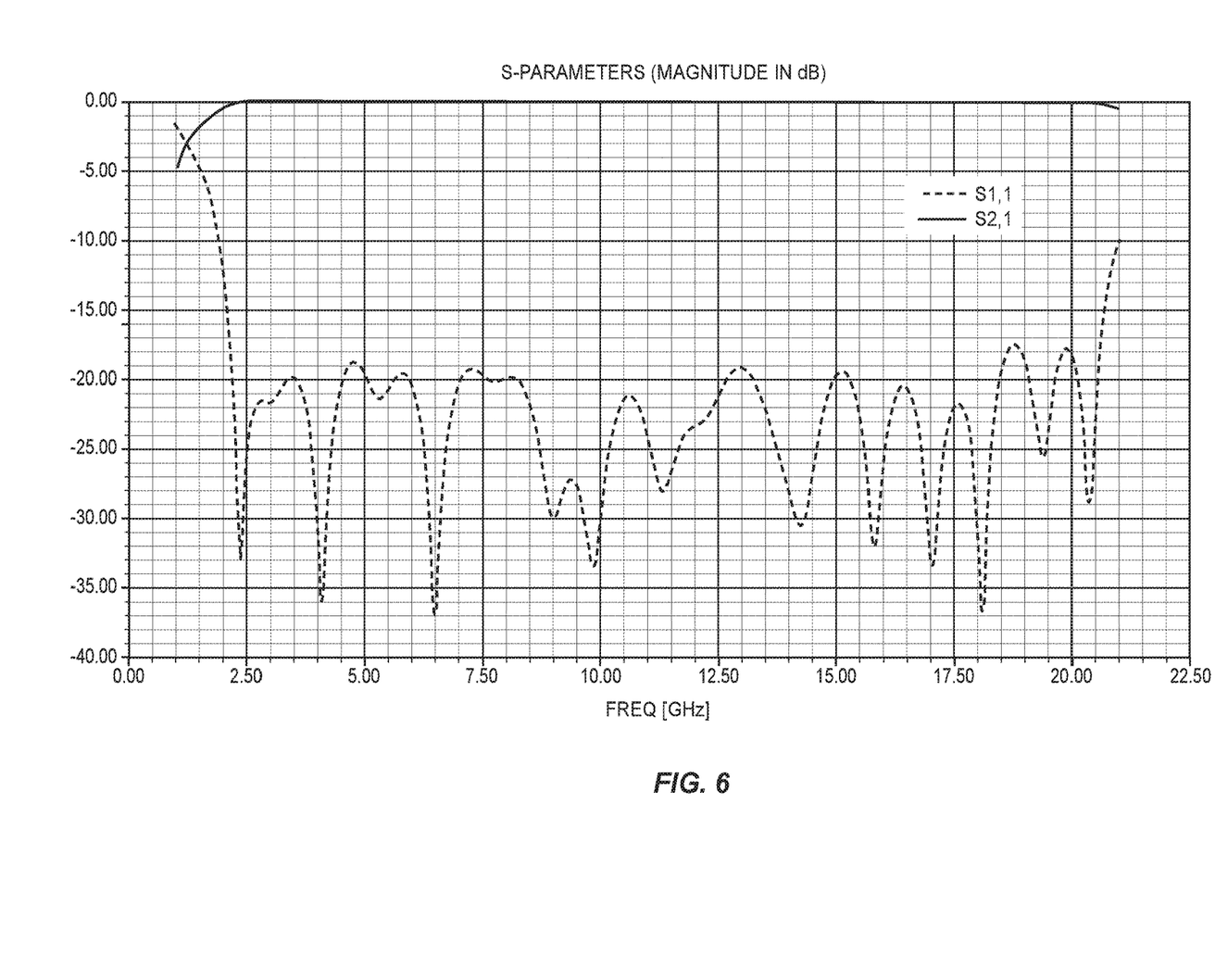
FIG. 6 is a scattering parameters plot (S-parameters) for a spatial power-combining device according to some embodiments.

FIG. 6 is a scattering parameters plot (S-parameters) for a spatial power-combining device according to some embodiments. In particular, FIG. 6 demonstrates a spatial power-combining device as previously described that is configured with an operating frequency range of 2-20 GHz. The S-parameter magnitude is plotted in decibels (dB) across a GHz frequency range. The return loss, or S1,1, is an indication of how much power is reflected from the antenna structure. For frequencies where S1,1 is equal to 0 dB, then substantially all power from a signal is reflected. The insertion loss, or S2,1, is an indication of how much power is transferred by the antenna structure. For frequencies where S2,1 is equal to 0 dB, then substantially all power from a signal is transferred. Notably, the S1,1 line is around −20 dB between 2 and 20 GHz, and the S2,1 line is about 0 dB between 2 and 20 GHz. Accordingly, the spatial power-combining device has good combining efficiency across the intended 2-20 GHz operating frequency range.

Figure 7A:
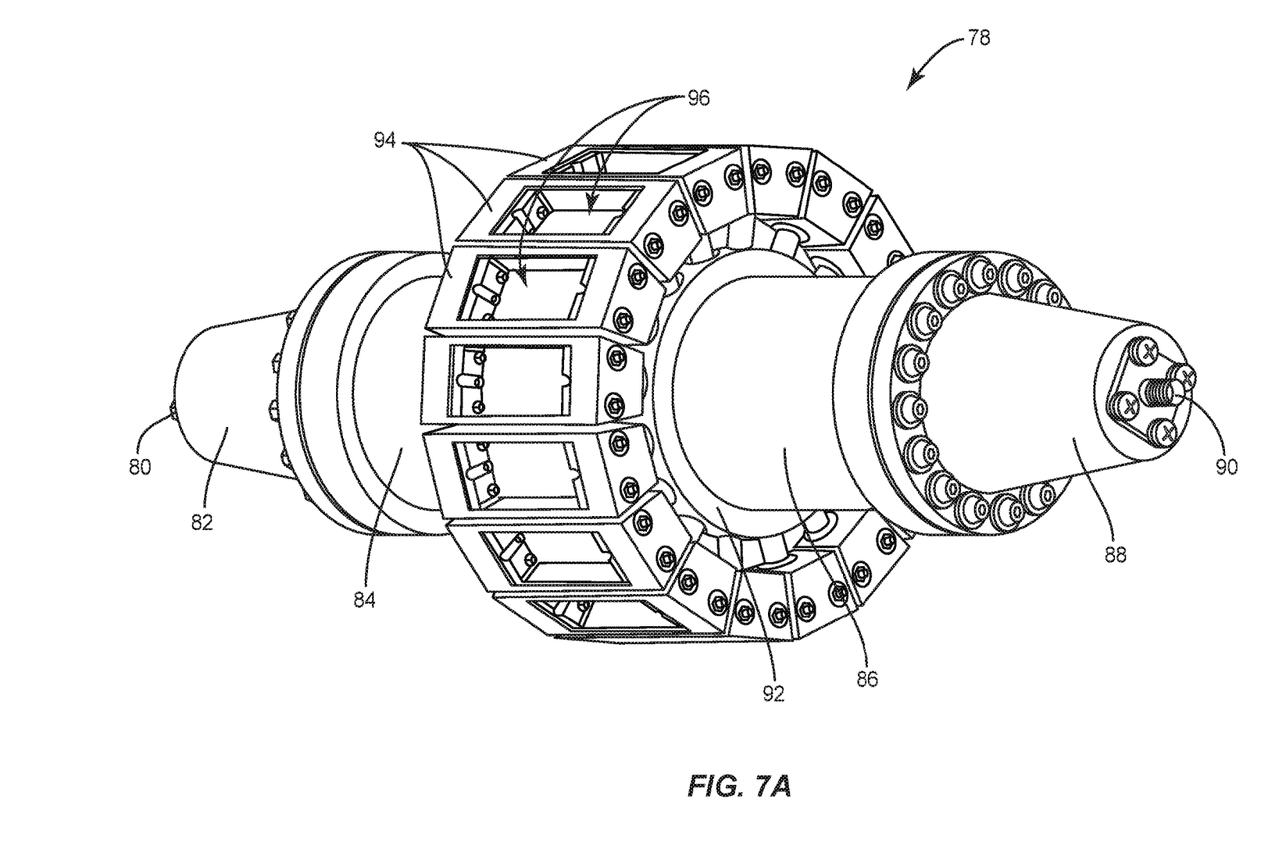
FIG. 7A is a perspective view of a spatial power-combining device according to some embodiments.

Some embodiments are related to a spatial power-combining device configured to receive a signal and subsequently split, amplify, and combine the signal to provide an amplified output signal. In that regard, FIG. 7A is a perspective view of a spatial power-combining device 78 according to some embodiments. The spatial power-combining device 78 includes an input port 80, an input coaxial waveguide section 82, an input center waveguide section 84, an output center waveguide section 86, an output coaxial waveguide section 88, and an output port 90 that are similar to the previously-described spatial power-combining device structure 10 of FIG. 1A and FIG. 1B. The spatial power-combining device 78 further includes a plate section 92 and a plurality of amplifier modules 94 radially arranged around the plate section 92. The plurality of amplifier modules 94 include corresponding ones of a plurality of openings 96. An amplifier may be mounted in an opening 96 and electrically coupled to the spatial power-combing device 78 via the corresponding amplifier module 94. The plurality of openings 96 may be covered. In some embodiments, the amplifier comprises a solid-state GaN-based MMIC.

Figure 7B:
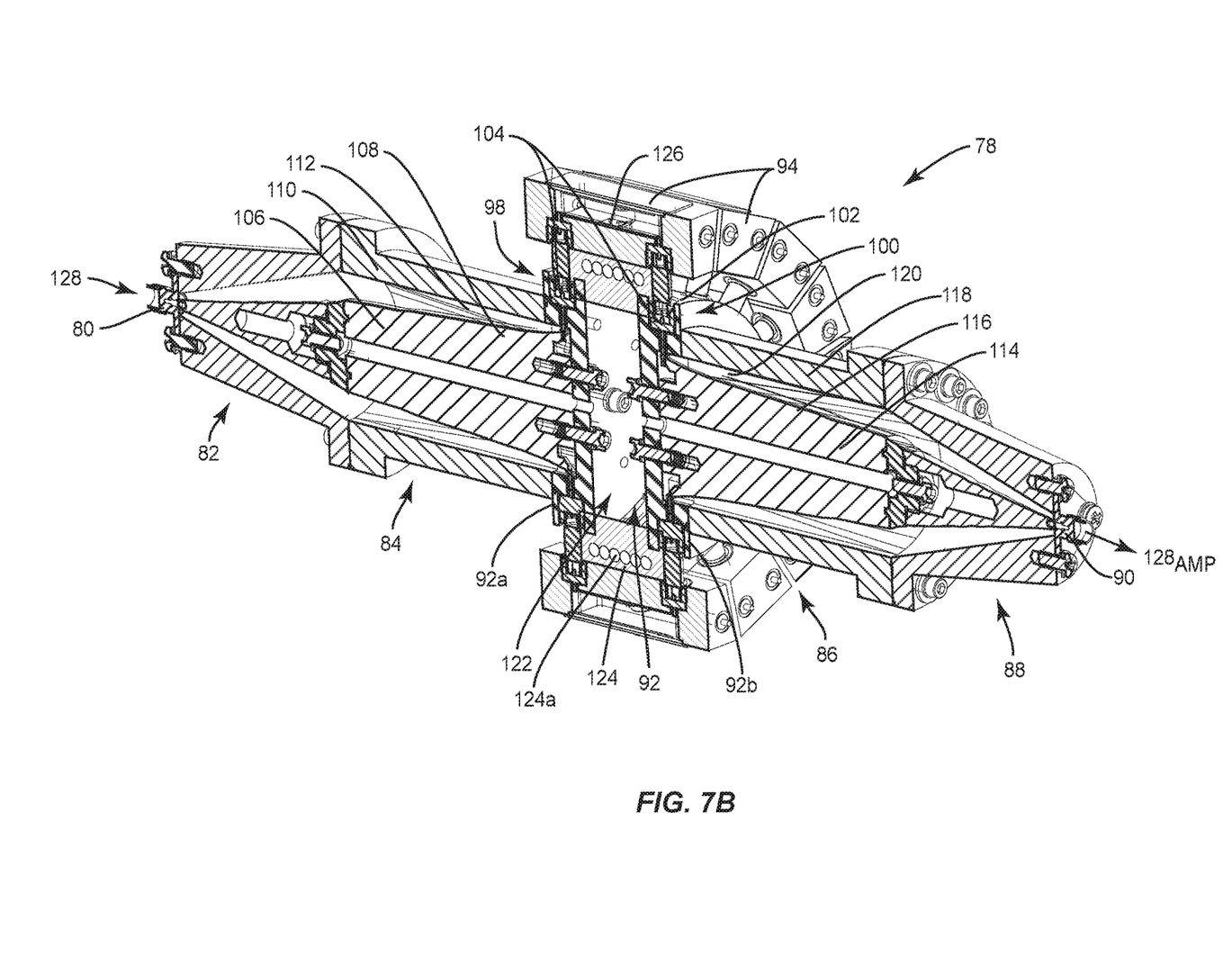
FIG. 7B is a partial cross-sectional view of the spatial power-combining device of FIG. 7A.

FIG. 7B is a partial cross-sectional view of the spatial power-combining device 78 of FIG. 7A. The plate section 92 comprises a first face 98, a second face 100 that opposes the first face 98, an exterior surface 102 between the first face 98 and the second face 100, and a plurality of amplifier connectors 104 accessible at the exterior surface 102. The plurality of amplifier modules 94 are coupled to corresponding pairs of the plurality of amplifier connectors 104. The input center waveguide section 84 is coupled to the plate section 92 at the first face 98, and the output center waveguide section 86 is coupled to the plate section 92 at the second face 100. The input coaxial waveguide section 82 is coupled to the input center waveguide section 84 and is configured to concurrently provide a signal to the input center waveguide section 84 and the plurality of amplifier connectors 104. The input port 80 is coupled to the input coaxial waveguide section 82. The output coaxial waveguide section 88 is coupled to the output center waveguide section 86 and is configured to concurrently receive amplified signals from the output center waveguide section 86 and the plurality of amplifier connectors 104. The output port 90 is coupled to the output coaxial waveguide section 88.

The input center waveguide section 84 includes an input inner housing 106 including a plurality of input antenna signal conductors 108 and an input outer housing 110 including a plurality of input antenna ground conductors 112. As previously described, the plurality of input antenna signal conductors 108 are separated from the plurality of input antenna ground conductors 112 by air. The plurality of input antenna signal conductors 108 are an integral single component with the input inner housing 106, and the plurality of input antenna ground conductors 112 are an integral single component with the input outer housing 110.

The output center waveguide section 86 includes an output inner housing 114 including a plurality of output antenna signal conductors 116 and an output outer housing 118 including a plurality of output antenna ground conductors 120. As previously described, the plurality of output antenna signal conductors 116 are separated from the plurality of output antenna ground conductors 120 by air. The plurality of output antenna signal conductors 116 are an integral single component with the output inner housing 114, and the plurality of output antenna ground conductors 120 are an integral single component with the output outer housing 118.

In some embodiments, the plate section 92 comprises a first plate 92a and a second plate 92b. The first plate 92a is coupled to the input center waveguide section 84, and the second plate 92b is coupled to the output center waveguide section 86. The first plate 92a and the second plate 92b comprise the plurality of amplifier connectors 104. Each amplifier module 94 is connected to a corresponding amplifier connector 104 in each of the first plate 92a and the second plate 92b.

The first plate 92a and the second plate 92b may form a cavity 122. In some embodiments, the cavity 122 may comprise open space and, in other embodiments, the cavity 122 may be filled with a thermally conductive medium, such as a thermally conductive fluid or gel, which helps dissipate heat generated by the spatial power-combining device 78. Exemplary thermally conductive mediums include ethylene glycol, alcohol, and Polyalphaolefin (PAO). In other embodiments, the plate section 92 comprises a single plate without the cavity 122. In this regard, the plate section 92 comprises a continuous solid material between the first face 98 and the second face 100, and no cavity 122 is formed. The continuous solid material may have good thermal conductivity to help dissipate heat generated by the spatial power-combining device 78. The continuous solid material may comprise, for example, aluminum or alloys thereof.

In some embodiments, a thermally conductive structure 124 may be configured between the plurality of amplifier modules 94 and the plate section 92 to provide further heat dissipation. The thermally conductive structure 124 is radially arranged around the plate section 92, and the plurality of amplifier modules 94 are radially arranged around the thermally conductive structure 124. In some embodiments, the thermally conductive structure 124 comprises a solid material, such as aluminum or alloys thereof. In other embodiments, the thermally conductive structure 124 comprises one or more channels 124a configured for fluid cooling. The one or more channels 124a extend radially within the thermally conductive structure 124 and may comprise a closed system or an open system. An open system may include an external pump or other techniques for circulating fluid within the thermally conductive structure 124. In some embodiments, the spatial power-combining device 78 is configured to be coupled with an external heat sink, and the thermally conductive structure 124 is thermally coupled to the external heat sink to provide a path for heat to dissipate from the spatial power-combining device 78.

The plurality of openings 96 of FIG. 7A are covered in FIG. 7B and an amplifier 126 is configured within each amplifier module 94. In operation, an input signal 128 enters through the input port 80 and propagates through the input coaxial waveguide section 82 and the input center waveguide section 84 where it is concurrently provided to the plurality of amplifier modules 94. The output center waveguide section 86 and the output coaxial waveguide section 88 concurrently receive portions of an amplified signal $128_{AMP}$ from the plurality of amplifier modules 94. The amplified signal $128_{AMP}$ exits through the output port 90. As described, the plurality of amplifier modules 94 are spaced apart from the input center waveguide section 84 and the output center waveguide section 86. Accordingly, the plurality of amplifier modules 94 have improved thermal capabilities that allow the spatial power-combining device 78 to be operated at higher temperatures with increased efficiency and higher overall output power.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising:
   a plate section comprising:
      a first face;
      a second face that opposes the first face;
      an exterior surface between the first face and the second face; and
      a plurality of amplifier connectors accessible at the exterior surface;
   a plurality of amplifier modules coupled to corresponding ones of the plurality of amplifier connectors;
   an input center waveguide section coupled to the plate section at the first face; and
   an output center waveguide section coupled to the plate section at the second face.

2. The spatial power-combining device of claim 1 wherein the input center waveguide section comprises:
   an input inner housing comprising a plurality of input antenna signal conductors; and
   an input outer housing comprising a plurality of input antenna ground conductors.

3. The spatial power-combining device of claim 2 wherein the plurality of input antenna signal conductors are separated from the plurality of input antenna ground conductors by air.

4. The spatial power-combining device of claim 2 wherein the plurality of input antenna signal conductors are an integral single component with the input inner housing, and the plurality of input antenna ground conductors are an integral single component with the input outer housing.

5. The spatial power-combining device of claim 1 wherein the output center waveguide section comprises:
   an output inner housing comprising a plurality of output antenna signal conductors; and
   an output outer housing comprising a plurality of output antenna ground conductors.

6. The spatial power-combining device of claim 5 wherein the plurality of output antenna signal conductors are completely separated from the plurality of output antenna ground conductors by air.

7. The spatial power-combining device of claim 5 wherein the plurality of output antenna signal conductors are an integral single component with the output inner housing, and the plurality of output antenna ground conductors are an integral single component with the output outer housing.

8. The spatial power-combining device of claim 1 further comprising:
   an input coaxial waveguide configured to concurrently provide a signal to the input center waveguide section and the plurality of amplifier connectors; and
   an output coaxial waveguide configured to concurrently receive amplified signals from the output center waveguide section.

9. The spatial power-combining device of claim 1 further comprising a thermally conductive structure configured between the plurality of amplifier modules and the plate section.

10. The spatial power-combining device of claim 9 wherein the thermally conductive structure comprises:
    one or more channels; and
    a fluid in the one or more channels.

* * * * *

UNITED STATES PATENT AND TRADEMARK OFFICE
CERTIFICATE OF CORRECTION

PATENT NO. : 10,263,651 B1  
APPLICATION NO. : 16/166548  
DATED : April 16, 2019  
INVENTOR(S) : John Kitt Page 1 of 1

It is certified that error appears in the above-identified patent and that said Letters Patent is hereby corrected as shown below:

In the Specification

In Column 8, Line 50, replace "section line Id" with --section line I-I--.

Signed and Sealed this  
Twenty-first Day of May, 2019

Andrei Iancu  
*Director of the United States Patent and Trademark Office*